United States Patent [19]
Itou

[11] Patent Number: 6,097,662
[45] Date of Patent: Aug. 1, 2000

[54] DYNAMIC SEMICONDUCTOR MEMORY DEVICE WITH LOW POWER CONSUMPTION MODE INCREASING ELECTROSTATIC CAPACITY OF MEMORY CELL THAN IN NORMAL OPERATION MODE

[75] Inventor: Takashi Itou, Hyogo, Japan

[73] Assignee: Mitsubishi Denki Kabushiki Kaisha, Tokyo, Japan

[21] Appl. No.: 09/240,002

[22] Filed: Jan. 29, 1999

[30] Foreign Application Priority Data

Aug. 7, 1998 [JP] Japan .................. 10-224305

[51] Int. Cl.[7] ............................................ G11C 8/00
[52] U.S. Cl. .................. 365/230.03; 365/230.06; 365/222; 365/201; 711/170; 711/106
[58] Field of Search ............ 365/230.03, 230.06, 365/222, 201; 711/170, 106

[56] References Cited

U.S. PATENT DOCUMENTS 5,719,815   2/1998   Takahashi et al. ............... 365/222
5,867,438   2/1999   Nomura et al. ................... 365/222

FOREIGN PATENT DOCUMENTS 56-159893   12/1981   Japan .

*Primary Examiner*—David Nelms
*Assistant Examiner*—Connie C. Yoha
*Attorney, Agent, or Firm*—McDermott, Will & Emery

[57] ABSTRACT

When memory storage capacity is required and power consumption is not so important, a semiconductor memory device is operated in a normal mode. When memory capacity is not so important and power consumption is to be suppressed, two memory cells are used connected in common to one bit line to store one data by rendering two word lines active at the same time. Accordingly, an operation of low power consumption with a longer refresh cycle is allowed. The user can appropriately switch between the two operation modes as necessary for usage.

10 Claims, 13 Drawing Sheets

DYNAMIC SEMICONDUCTOR MEMORY DEVICE WITH LOW POWER CONSUMPTION MODE INCREASING ELECTROSTATIC CAPACITY OF MEMORY CELL THAN IN NORMAL OPERATION MODE

BACKGROUND OF THE INVENTION

1. Field of the Invention

The present invention relates to dynamic semiconductor memory devices, and more particularly, to a dynamic random access memory (DRAM) that can store information in its capacitor.

2. Description of the Background Art

FIG. 18 schematically shows a row decoder and a memory cell array of a DRAM.

Referring to FIG. 18, an externally applied row address to a semiconductor memory device is internally held to become internal row address signals INTA0–INTAn to be applied to a row decoder 722. Row decoder 722 decodes internal address signals INTA0–INTAn to output a word line activation signal that activates any one of word lines WL0–WLn. Here, a conventional semiconductor memory device connects one memory cell with a bit line (not shown) to amplify the data, whereby the data is read out in binary of an H logical high) level or an L (logical low) level.

It is desirable in a small type information equipment that is driven by a battery such as a portable terminal for the semiconductor memory device to consume lower power in a resume or suspend state than in a normal usage state where the user is operating the terminal. Lengthening the refresh cycle of the stored information in the DRAM is one approach. For this purpose, the capacitance of the capacitor per one memory cell in the DRAM should be increased. In a resume or suspend state, lower power consumption is more desirable than a large storage capacity for a semiconductor memory device functioning as the main memory.

In contrast, a larger storage capacity is more desirable for the main memory in the normal usage state where the user is operating the terminal.

Increasing the capacitance of the capacitor per one memory cell in a DRAM and increasing the storage capacity both cause increase in the chip area of the DRAM. In applications where low power consumption is required for the small type information equipment, there were a problem that either increase in the storage capacity of the memory or reduction in the storage capacity of the memory to increase the driving period of time of the battery in a resume or suspend state must be selected.

SUMMARY OF THE INVENTION

An object of the present invention is to provide a dynamic semiconductor memory device that has a longer refresh cycle to reduce power consumption by increasing the storage capacity of the memory in a normal usage state where the user operates the terminal, and by reducing the memory storage capacity in a resume or suspend state.

According to an aspect of the present invention, a dynamic semiconductor memory device includes a first memory array. The first memory array includes first and second memory cells, a first bit line to transmit data input/output with respect to the first and second memory cells, a first word line to select the first memory cell, a second word line to select the second memory cell, and a cell select circuit to activate first and second word lines according to an address signal to select first and second memory cells. The cell select circuit includes a first row decode circuit selecting one of the first and second memory cells according to the address signal in a first mode, and selecting the first and second memory cells according to an address signal corresponding to the first memory cell in a second mode.

The main advantage of the present invention is that the dynamic semiconductor memory device includes a mode of a large storage capacity using one memory cell for retaining one data, and a mode of low power consumption that uses two memory cells for retaining one data. The user can select either mode. Thus, the user can appropriately switch between these two operating modes according to its need of usage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
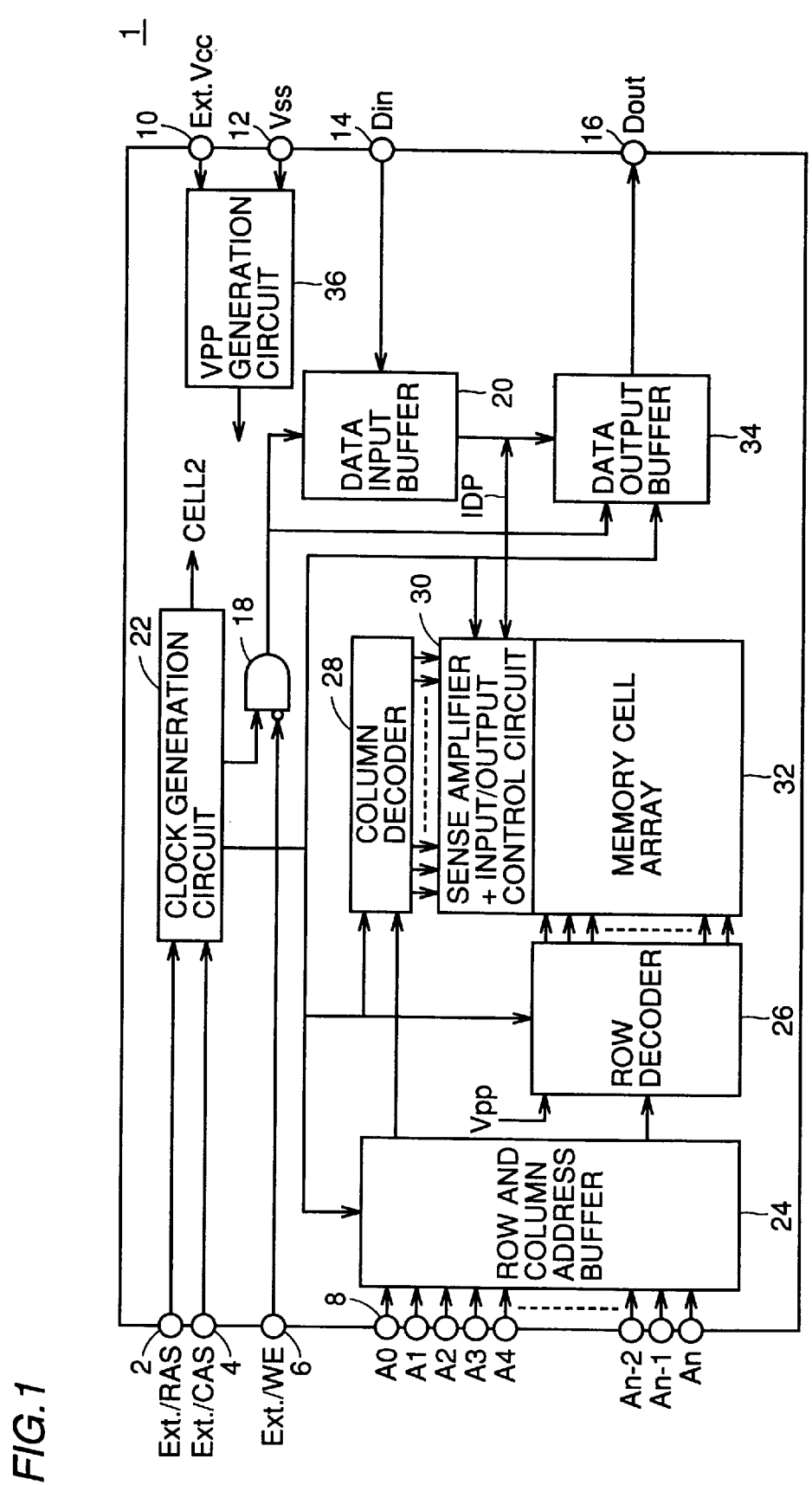
FIG. 1 is a schematic block diagram showing a structure of a semiconductor memory device 1 according to a first embodiment of the present invention.

Embodiment of the present invention will be described hereinafter with respect to the drawings. In the drawings, the same or corresponding component have the same reference characters allotted.

First Embodiment

Referring to FIG. 1, a semiconductor memory device 1 according to a first embodiment of the present invention includes control signal input terminals 2–6, an address input terminal group 8, an input terminal 14 to which a data signal Din is input, an output terminal 16 from which a data signal Dout is output, a ground terminal 12 receiving a ground potential Vss, and a power supply terminal 10 receiving an external power supply potential Ext. Vcc.

Semiconductor memory device 1 further includes a clock generation circuit 22, a row and column address buffer 24, a row decoder 26, a column decoder 28, a sense amplifier+ input/output control circuit 30, a memory cell array 32, a gate circuit 18, a data input buffer 20, and a data output buffer 34.

Clock generation circuit 22 generates a control clock corresponding to a predetermined operation mode according to an externally applied external row address strobe signal Ext./RAS and an external column address strobe signal Ext./CAS applied via control signal input terminals 2 and 4 to control the entire operation of semiconductor memory device 1. In the self refresh operation where low power consumption is required, a mode select signal CELL2 that will be described afterwards is rendered active.

Row and column address buffer 24 provides an internal row address signal and an internal column address signal generated according to externally applied address signals A0–An (n is a natural number) to row decoder 26 and column decoder 28, respectively.

The memory cell in memory cell array 32 specified by row decoder 26 and column decoder 28 has data input or output through input terminal 14 or output terminal 16 via sense amplifier+input/output control circuit 30 and data input buffer 20 or data output buffer 22.

Figure 2:
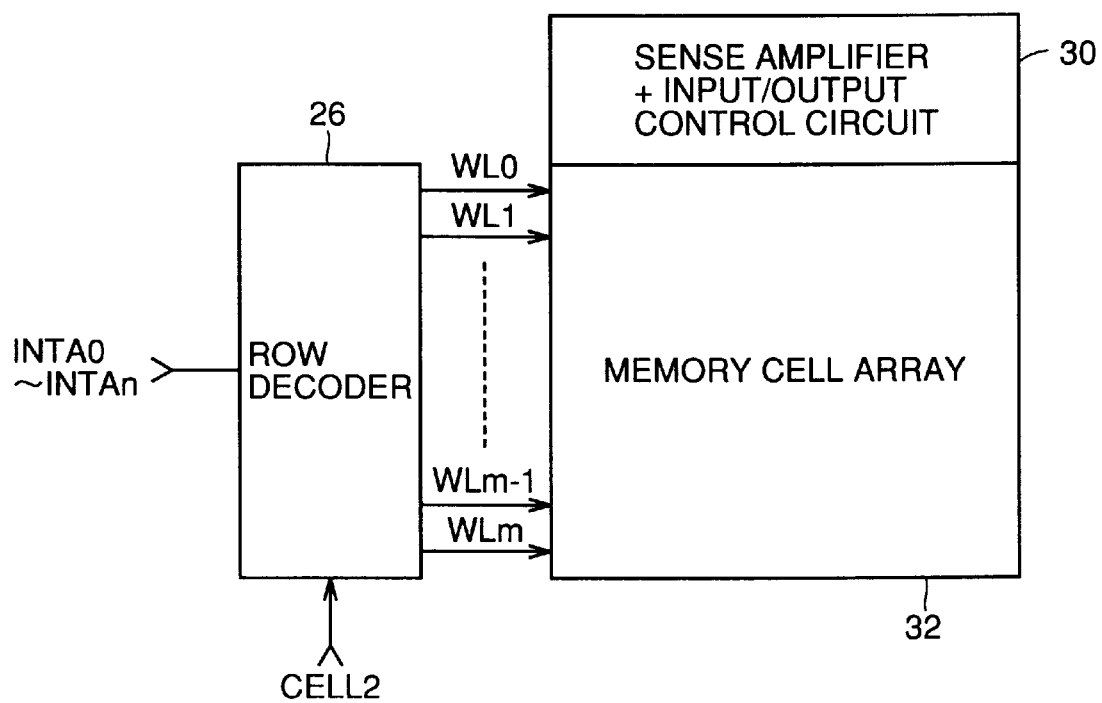
FIG. 2 schematically shows a row decoder 26, a memory cell array 32, and a sense amplifier+input/output control circuit 30.

Referring to FIG. 2, row decoder 26 receives and decodes internal row address signals INTA0–INTAn to activate word lines WL0–WLm (m: natural number). It is to be noted that row decoder 26 differs from the conventional case in that the manner of activating a word line is altered by modifying the decode operation according to mode select signal CELL2.

Figure 3:
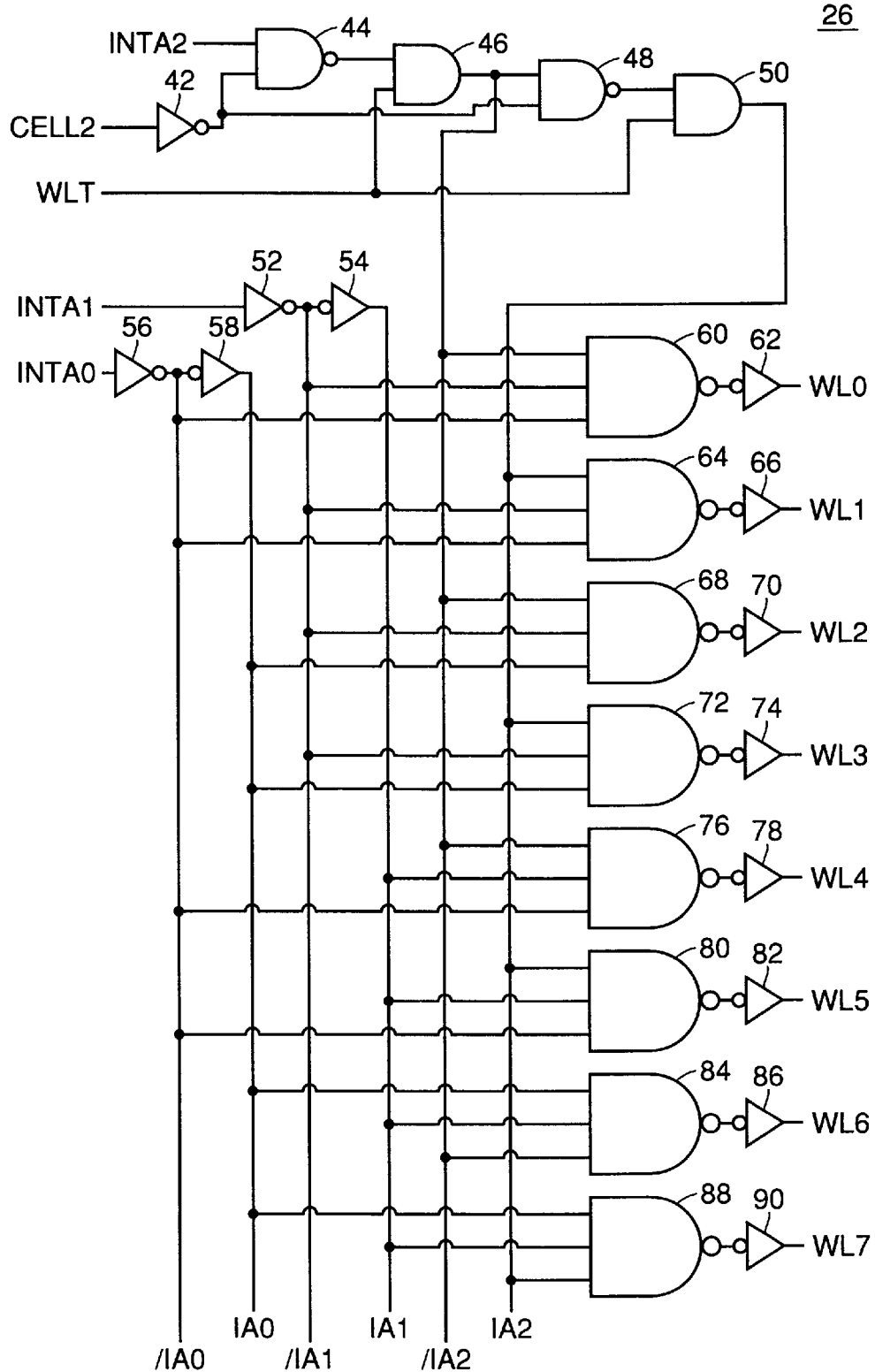
FIG. 3 is a circuit diagram showing a structure of row decoder 26 of FIG. 2.

FIG. 3 is a circuit diagram showing a structure of row decoder 26 of FIG. 2. For the sake of simplification, the case of 3 bits of INTA0–INTA2 as internal address signals INTA0–INTAn will be described.

Referring to FIG. 3, row decoder 26 includes an inverter 42 receiving and inverting mode select signal CELL2, a NAND circuit 44 receiving the output of inverter 42 and an internal address signal INTA2, an AND circuit 46 receiving the output of NAND circuit 44 and a word line activation signal WLT, a NAND circuit 48 receiving the output of AND circuit 46 and the output of inverter 42, and an AND circuit 50 receiving the output of NAND circuit 48 and word line activation signal WLT. The output of AND circuit 46 becomes a predecode signal /IA2, whereas the output of AND circuit 50 becomes a predecode signal IA2.

Row decoder 26 further includes an inverter 52 receiving and inverting internal address signal INTAL to output a predecode signal /IA1, an inverter 54 receiving and inverting predecode signal /IA1 to output a predecode signal IA1, an inverter 56 receiving and inverting internal address signal INTA0 to output a predecode signal /IA0, and an inverter 58 receiving and inverting predecode signal /IA0 to output a predecode signal /IA0.

Row decoder 26 further includes a 3 NAND circuit 60 receiving predecode signals /IA0, /IA1, /IA2, an inverter 62 receiving and inverting the output of 3 NAND circuit 60 to output a word line activation signal WL0, a 3 NAND circuit 64 receiving predecode signals /IA0, /IA1, IA2, an inverter 66 receiving and inverting the output of 3 NAND circuit 64 to output a word line activation signal WL1, a 3 NAND circuit 68 receiving predecode signals IA0, /IA1, /IA2, an inverter 70 receiving and inverting the output of 3 NAND circuit 68 to output a word line activation signal WL2, a 3 NAND circuit 72 receiving predecode signals IA0, /IA1, IA2, and an inverter 74 receiving and inverting the output of 3 NAND circuit 72 to output a word line activation signal WL3.

Row decoder 26 further includes a 3 NAND circuit 76 receiving predecode signals /IA0, IA1, /IA2, an inverter 78 receiving the output of 3 NAND circuit 76 to output a word line activation signal WL4, a 3 NAND circuit 80 receiving predecode signals /IA0, IA1, IA2, an inverter 82 receiving and inverting the output of 3 NAND circuit 80 to output a word line activation signal WL5, a 3 NAND circuit 84 receiving predecode signals IA0, IA1, IA2, an inverter 86 receiving and inverting the output of 3 NAND circuit 84 to output a word line activation signal WL6, a 3 NAND circuit 88 receiving predecode signals IA0, IA1, IA2, and an inverter 90 receiving and inverting the output of 3 NAND circuit 88 to output a word line activation signal WL7.

Row decoder 26 activates one of word line activation signals WL0–WL7 according to the value of internal address signals INTA0–INTA2 and word line activation signal WLT when mode select signal CELL2 is at an L level. When mode select signal CELL2 is at an H level, both of predecode signals /IA2 and IA2 attain an H level in response to word line activation signal WLT rendered activate of an H level. Therefore, two of word line activation signals WL0–WL7 are rendered active.

Figure 4:
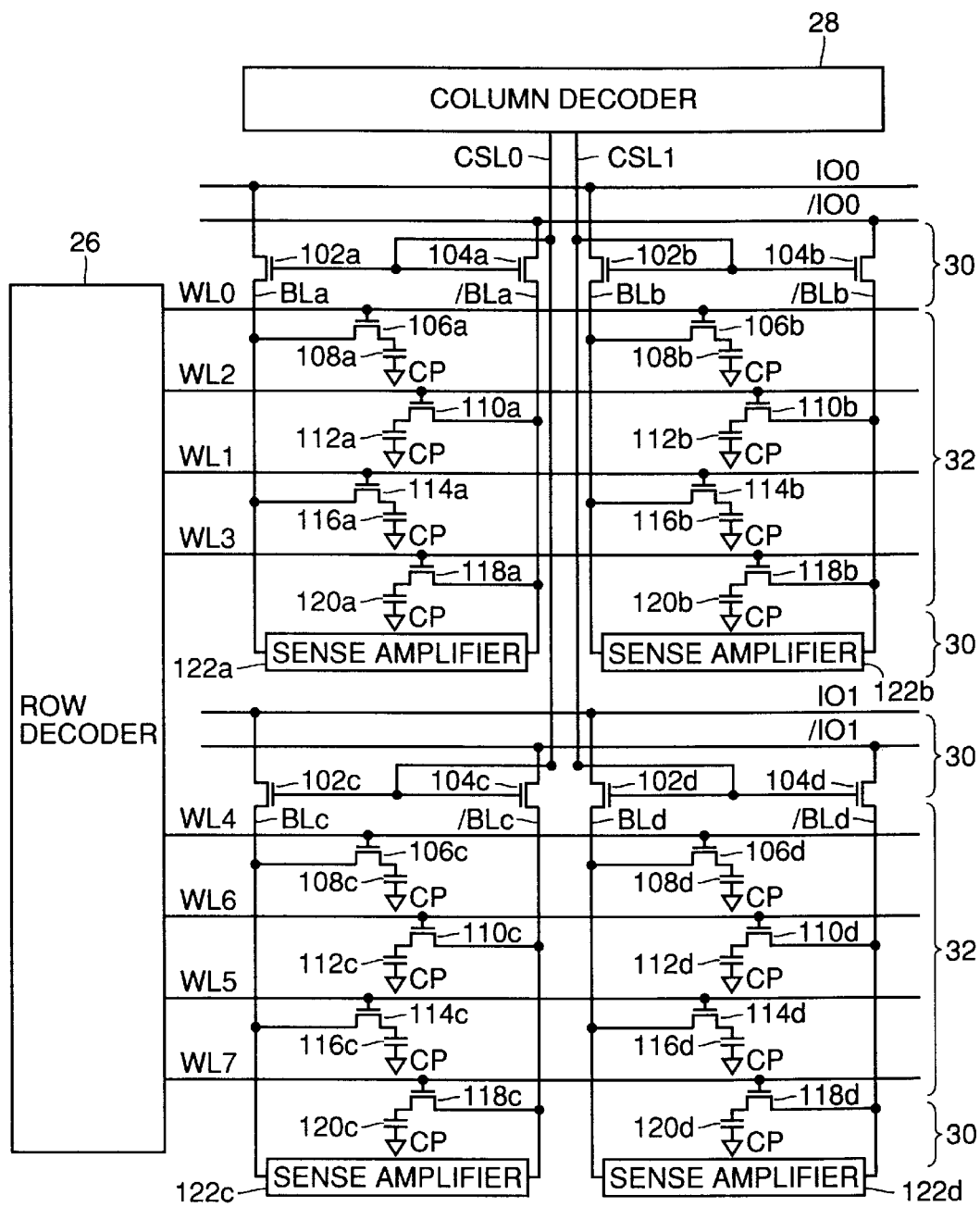
FIG. 4 is a circuit diagram for describing a structure of sense amplifier+input/output control circuit 30 and a memory cell array 32.

FIG. 4 is a circuit diagram for describing a structure of sense amplifier+input/output control circuit 30 and a memory cell array 32 of FIG. 1. A block of row decoder 26 and column decoder 28 is also illustrated for reference in order to clarify the connection.

Referring to FIG. 4, sense amplifier+input/output control circuit 30 includes an N channel MOS transistor 102a rendered active by a column select signal CSL0 to connect an input/output signal line IO0 and a bit line BLa, an N channel MOS transistor 104a rendered active by a column select signal CSL0 to connect an input/output signal line /IO0 and a bit line /BLa, and sense amplifier 122a amplifying the potential difference between bit line BLa and bit line /BLa.

Sense amplifier+input/output control circuit 30 further includes an N channel MOS transistor 102b rendered active by a column select signal CSL1 to connect input/output signal line IO0 and a bit line BLb, an N channel MOS transistor 104b rendered active by a column select signal CSL1 to connect input/output signal line /IO0 and a bit line /BLb, and a sense amplifier 122b amplifying the potential difference between bit line BLb and bit line /BLb.

Sense amplifier+input/output control circuit 30 further includes an N channel MOS transistor 102c rendered active by column select signal CSL0 to connect input/output signal line IO1 and a bit line BLc, an N channel MOS transistor 104c rendered active by column select signal CSL0 to connect input/output signal line /IO1 and a bit line /BLc, and a sense amplifier 122c amplifying the potential difference between bit line BLc and bit line /BLc.

Sense amplifier+input/output control circuit 30 further includes an N channel MOS transistor 102d rendered active by column select signal CSL1 to connect input/output signal line IO1 and a bit line BLd, an N channel MOS transistor 104d rendered active by column select signal CSL1 to connect input/output signal line /IO1 and a bit line /BLd, and a sense amplifier 122d amplifying the potential difference between bit line BLd and bit line /BLd.

Memory cell array 32 includes a capacitor 108a having one electrode connected to a cell plate CP and the other electrode serving as a storage node to store information, an access transistor 106a rendered active by word line activation signal WL0 to connect the storage node of capacitor 108a with bit line BLa, a capacitor 112a having one electrode connected to cell plate CP, and the other electrode serving as a storage node, an access transistor 110a rendered active by word line activation signal WL2 to connect the storage node of capacitor 112a with bit line /BLa, a capacitor 116a having one electrode connected cell plate CP and the other electrode serving as a storage node, an access transistor 114a rendered active by word line activation signal WL1 to connect the storage node of capacitor 116a with bit line BLa, a capacitor 120a having one electrode connected to cell plate CP and the other electrode serving as a storage node, and an access transistor 118a rendered active by word line activation signal WL3 to connect the storage node of capacitor 120a with bit line /BLa.

Memory cell array 32 further includes a capacitor 108b having one electrode connected to cell plate CP and the other electrode serving as a storage node to store information, an access transistor 106b rendered active by word line activation signal WL0 to connect the storage node of capacitor 108b with bit line BLb, a capacitor 112b having one electrode connected to cell plate CP and the other electrode serving as a storage node, an access transistor 110b rendered active by word line activation signal WL2 to connect the storage node of capacitor 112b with bit line /BLb, a capacitor 116b having one electrode connected cell plate CP and the other electrode serving as a storage node, an access transistor 114b rendered active by word line activation signal WL1 to connect the storage node of capacitor 116b with bit line BLb, a capacitor 120b having one electrode connected to cell plate CP and the other electrode serving as a storage node, and an access transistor 118b rendered active by word line activation signal WL3 to connect the storage node of capacitor 120b with bit line /BLb.

Memory cell array 32 further includes a capacitor 108c having one electrode connected to cell plate CP and the other electrode serving as a storage node to store information, an access transistor 106c rendered active by word line activation signal WL4 to connect the storage node of capacitor 108c to bit line BLc, a capacitor 112c having one electrode connected to cell plate CP and the other electrode serving as a storage node, an access transistor 110c rendered active by word line activation signal WL6 to connect the storage node of capacitor 112c with bit line /BLc, a capacitor 116c having one electrode connected to cell plate CP and the other electrode serving as a storage node, an access transistor 114c rendered active by word line activation signal WL5 to connect the storage node of capacitor 116c with bit line BLc, a capacitor 120c having one electrode connected to cell plate CP and the other electrode serving as a storage node, and an access transistor 118c rendered active by word line activation signal WL7 to connect the storage node of capacitor 120c with bit line /BLc.

Memory cell array 32 further includes a capacitor 108d having one electrode connected to cell plate CP and the other electrode serving as a storage node to storing information, an access transistor 106d rendered active by word line activation signal WL4 to connect the storage node of capacitor 108d with bit line BLd, a capacitor 112d having one electrode connected to cell plate CP and the other electrode serving as a storage node, an access transistor 110d rendered active by word line activation signal WL6 to connect the storage node of capacitor 112d with bit line /BLd, a capacitor 116d having one electrode connected to cell plate CP and the other electrode serving as a storage node, an access transistor 114d rendered active by word line activation signal WL5 to connect the storage node of capacitor 116d with bit line BLd, a capacitor 120d having one electrode connected to cell plate CP and the other electrode serving as a storage node, and an access transistor 118d rendered active by word line activation signal WL7 to connect the storage node of capacitor 120d with bit line /BLd.

Figure 5:
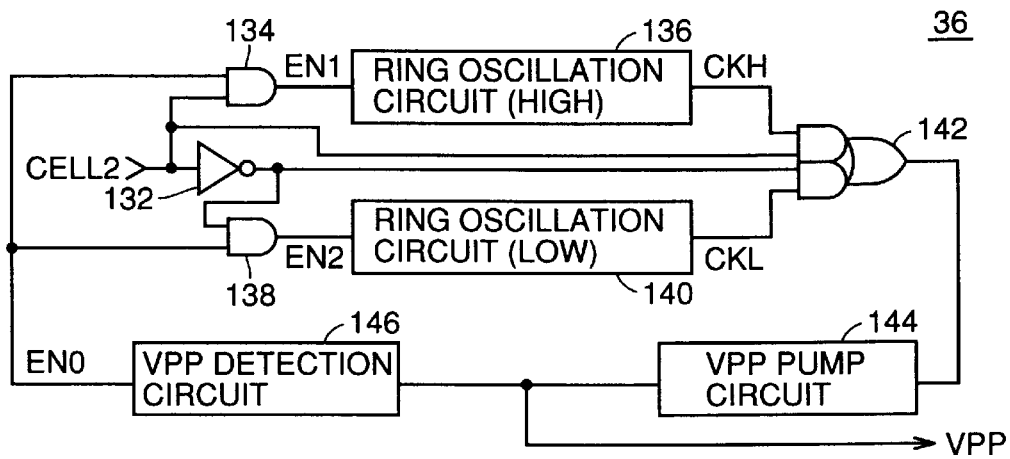
FIG. 5 is a block diagram showing a structure of a VPP generation circuit 36 of FIG. 1.

Referring to FIG. 5, VPP generation circuit 36 shown in FIG. 1 includes a VPP sense circuit 146 activating a enable signal EN0 when a boosted potential VPP has not arrived at a predetermined voltage level, an inverter 132 receiving and inverting mode select signal CELL2, an AND circuit 134 receiving mode select signal CELL2 and enable signal EN0 to generate an enable signal EN1, a ring oscillation circuit (High) 136 rendered active when enable signal EN1 is at an H level to generate a clock signal CKH, an AND circuit 138 receiving the output of inverter 132 and enable signal EN0 to output an enable signal EN2, a ring oscillation circuit (Low) 140 rendered active when enable signal EN2 is at an H level to generate clock signal CKL, a clock select gate 142 providing clock signal CKH and a clock signal CKL when mode select signal CELL2 is at an H level and L level, respectively, and a VPP pump circuit 144 generating boosted potential VPP according to the clock signal output from clock select gate 142.

Figure 6:
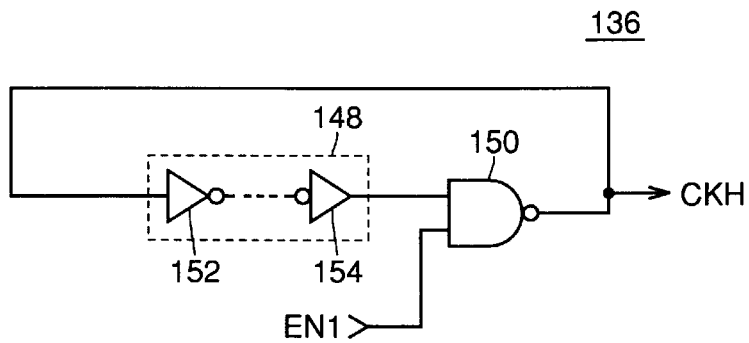
FIG. 6 is a circuit diagram showing a structure of a ring oscillation circuit (High) 136 of FIG. 5.

Referring to FIG. 6, ring oscillation circuit (High) 136 includes a NAND circuit 150 providing clock signal CKH when enable signal EN1 is at an H level, and a delay circuit 148 receiving and delaying clock signal CKH to feed back the delayed signal to the input of NAND circuit 150.

Delay circuit 148 includes an even number of stages of inverters 152–154 connected in series. The number of stages of the inverters is increased or decreased as necessary.

Figure 7:
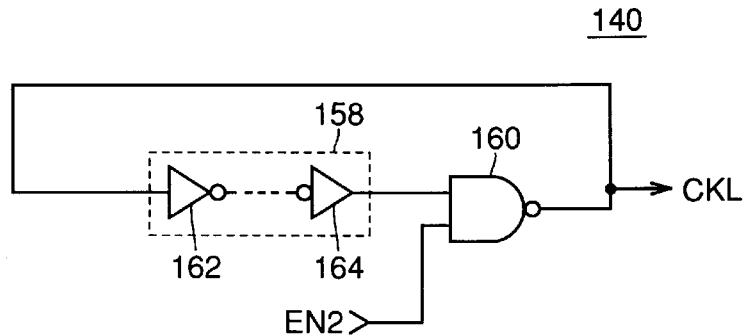
FIG. 7 is a circuit diagram showing a structure of a ring oscillation circuit (Low) 140 of FIG. 5.

Referring to FIG. 7, ring oscillation circuit (Low) 140 includes a NAND circuit 160 providing clock signal CKL when enable signal EN2 is at an H level, and a delay circuit 158 receiving and delaying clock signal CKL to feed back the delayed signal to the input of NAND circuit 160.

Delay circuit 158 includes an even number of stages of inverters 162–164 connected in series. The number of these inverters is set greater than the number of inverters in delay circuit 148 of FIG. 6. Since delay circuit 158 has a delay time greater than that of delay circuit 148, the oscillation frequency of ring oscillation circuit 140 becomes lower than the oscillation frequency of ring oscillation circuit 136.

Figure 8:
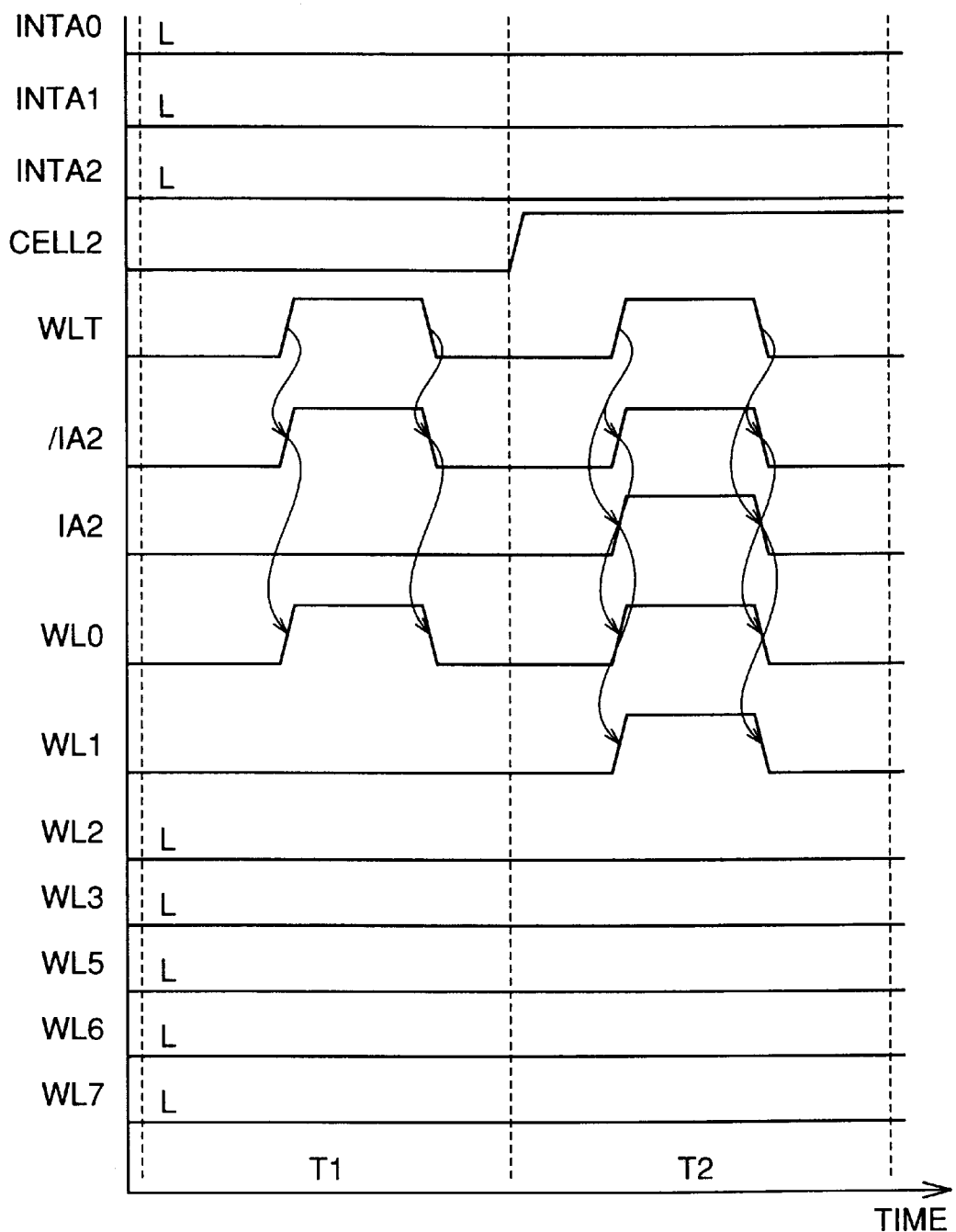
FIG. 8 is an operation waveform diagram for describing word line selection in a semiconductor memory device of the first embodiment.

FIG. 8 is an operation waveform diagram to describe word line selection in the semiconductor memory device of the first embodiment.

Referring to FIGS. 3 and 8, mode select signal CELL2 is at an L level during period T1. Here, it is assumed that all internal address signals INTA0–INTA2 are at an L level. When word line activation signal WLT is pulled up to an H level from an L level, predecode signal /IA2 out of predecode signal IA2 and /IA2 in row decoder 26 is rendered active since internal address signal INTA2 is at an L level. Since internal address signals INTA0 and INTA1 are both at an L level, only word line activation signal WL0 is rendered active. In response to the fall of word line activation signal WLT, predecode signal /IA2 and then word line activation signal WL0 are pull down.

Period T2 correspond to the case where the apparatus in which the semiconductor memory device is employed is at a low power consumption mode such as a resume state. Here, mode select signal CELL2 is set to an H level. Similar to the period of T1, a case where all of internal address signals INTA0–INTA2 are at an L level is considered. When word line activation signal WLT is pull up to an H level from an L level, internal address signal INTA2 is at an L level and mode select signal CELL2 is at an H level. Therefore, predecode signals IA2 and /IA2 are both rendered active from an L level to an H level. Since internal address signals INTA0 and INTA1 are both at an L level, word line activation signals WL0 and WL1 are both driven from an L level to an H level.

Here, word line activation signals WL0 and WL1 connect at one time the storage nodes of capacitors 108a and 116a in memory cell array 32 shown in FIG. 4 with bit line BLa. Therefore, the same information will be written or read out into or from the storage nodes of capacitors 108a and 116a.

Since word line activation signal WL1 has to be rendered active in addition to word line activation signal WL0, the drivability of the VPP generation circuit supplying the boosted potential to drive these activation signals must be increased.

When mode select signal CELL2 shown in FIG. 5 is at an H level, the clock that drives VPP pump circuit 144 is a high clock signal. Therefore, the capability of VPP generation circuit 36 supplying a boosted potential is increased at period T2.

In a DRAM, the charge stored in the storage node of the capacitor in a memory cell is gradually lost over time. Therefore, the refresh operation of reading out the data stored in the storage node and writing again the data at every constant period is required.

When an access transistor is rendered conductive, the charge stored in the capacitor is discharged to the bit line. As a result, the potential of the bit line is altered. The cycle of the refresh operation must be carried out when this potential difference is greater than the potential difference that can be amplified by sense amplifier 112a.

By storing the same information in capacitor 116a as well as in capacitor 108a to discharge twice as great the charge onto the bit line, the potential change of the bit line will become greater, so that the refresh cycle can be lengthened. Thus, power consumption can be suppressed.

As described above, the semiconductor memory device of the first embodiment has mode select signal CELL2 of an L level applied in a normal operation mode. Here, row decoder 26 receives and decodes internal address signals INTA0–INTAn to activate one of word line WL0–WLm. In response to this activation, data transfer or data refresh with respect to a predetermined memory cell is carried out.

In the case where low power consumption such as in a suspend and or resume state is required, mode select signal CELL2 is set to an H level. In response, row decoder 26 activates two predetermined word lines out of word lines WL0–WLm according to internal row address signals INTA0–INTAn. In response to this activation, the semiconductor memory device has the data in the memory cell array refreshed. Here, one data is stored into two memory cells. More specifically, two memory cells are connected to one bit line when two word lines are selected simultaneously, whereby the charge stored in the two memory cells is discharged onto the bit line. As a result, a greater potential difference is generated between the pair of bit lines than in this case where only one memory cell is connected. This is attributed to the change in the ratio of the capacitance of the bit line to the capacitance of the memory cell. Thus, the refresh cycle can be lengthened.

In other words, mode select signal CELL2 is set at an L level to carry out a storage operation as a normal DRAM when memory capacity is more important than power consumption, and mode select signal CELL2 is set at an H level to allow a low consumption power operation with a longer refresh cycle when lower power consumption is more important than the storage capacity. The user can appropriately switch between the two operation modes as necessary.

Second Embodiment

A semiconductor memory device according to a second embodiment of the present invention differs from the semiconductor memory device of the first embodiment in that row decoder 100 is provided instead of row decoder 26.

Figure 9:
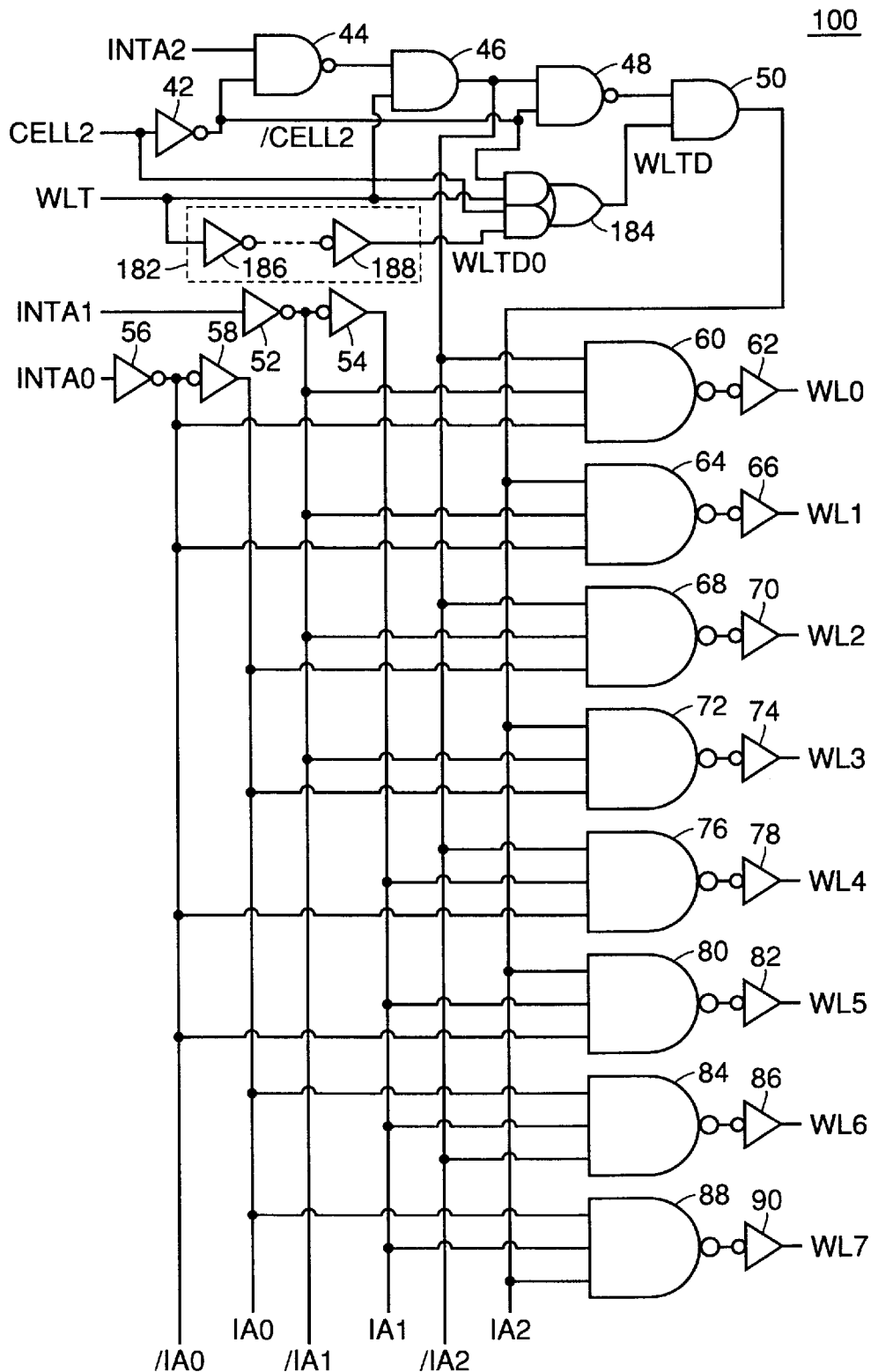
FIG. 9 is a circuit diagram showing a structure of a row decoder 100 used in a second embodiment of the present invention.

FIG. 9 is a circuit diagram showing a structure of row decoder 100 of the second embodiment.

Referring to FIG. 9, the semiconductor memory device of the second embodiment differs from the semiconductor memory device of the first embodiment in that row decoder 100 further includes a delay circuit 182 receiving and delaying word line activation signal WLT to output a word line activation signal WLTD0, and a select gate 184 providing word line activation signal WLT as a word line activation signal WLTD to AND circuit 50 when mode select signal CELL2 is at an L level, and providing a word line activation signal WLTD0 as word line activation signal WLTD to AND circuit 50 when mode select signal CELL2 is at an H level. Delay circuit 182 includes an even number of stages of inverters 186–188 connected in series, receiving word line activation signal WLT to output word line activation signal WLTD.

The remaining elements are similar to those of row decoder 26 of FIG. 3. Therefore description thereof will not be repeated.

Figure 10:
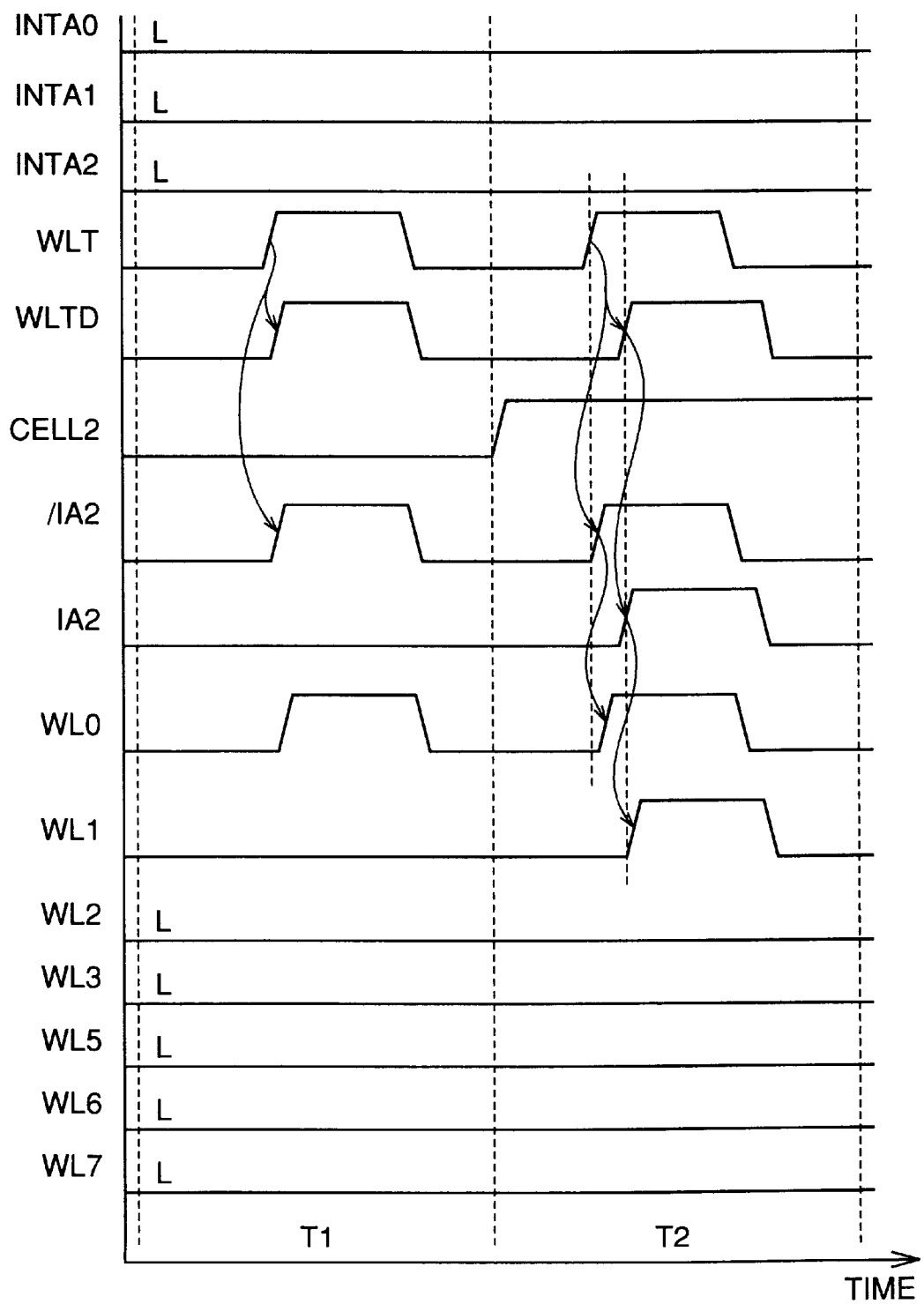
FIG. 10 is an operation waveform diagram for describing an operation of row decoder 100.

FIG. 10 is an operation waveform diagram to describe an operation of row decoder 100.

Referring to FIG. 10, mode select signal CELL2 is at an L level during period T1. Here, it is assumed that all of internal address signals INTA0–INTA2 are at an L level. When word line activation signal WLT is driven from an L level to an H level, internal address signals INTA2 is an L level. Therefore, only predecode signal /IA2 out of predecode signals IA2 and /IA2 of row decoder 100 is rendered active. Since internal address signals INTA0 and INTAL are both at an L level, only word line activation signal WL0 is rendered active. In response to the fall of word line activation signal WLT, predecode signals /IA2 and then word line activation signal WL0 fall.

At period T2 where mode select signal CELL2 is set to an H level, word line activation signal WLTD shown in FIG. 9 is rendered active according to the output of the delay circuit 182. Therefore, the rise of predecode signal IA2 is delayed than the rise of predecode signal /IA2 according to the amount of delay of delay circuit 182. This means that the rising timing and the falling timing of word line activation signals WL0 and WL1 rendered active at one time are deviated. The current is consumed by VPP generation circuit 36 of FIG. 1 to charge the word line at the rise of the word line activation signal. Therefore, by pulling up these word line activation signals in a deviated manner, two word line activation signals at an active state can be obtained at the same time without having to increase the current supply capability of VPP generation circuit 36.

Third Embodiment

Figure 11:
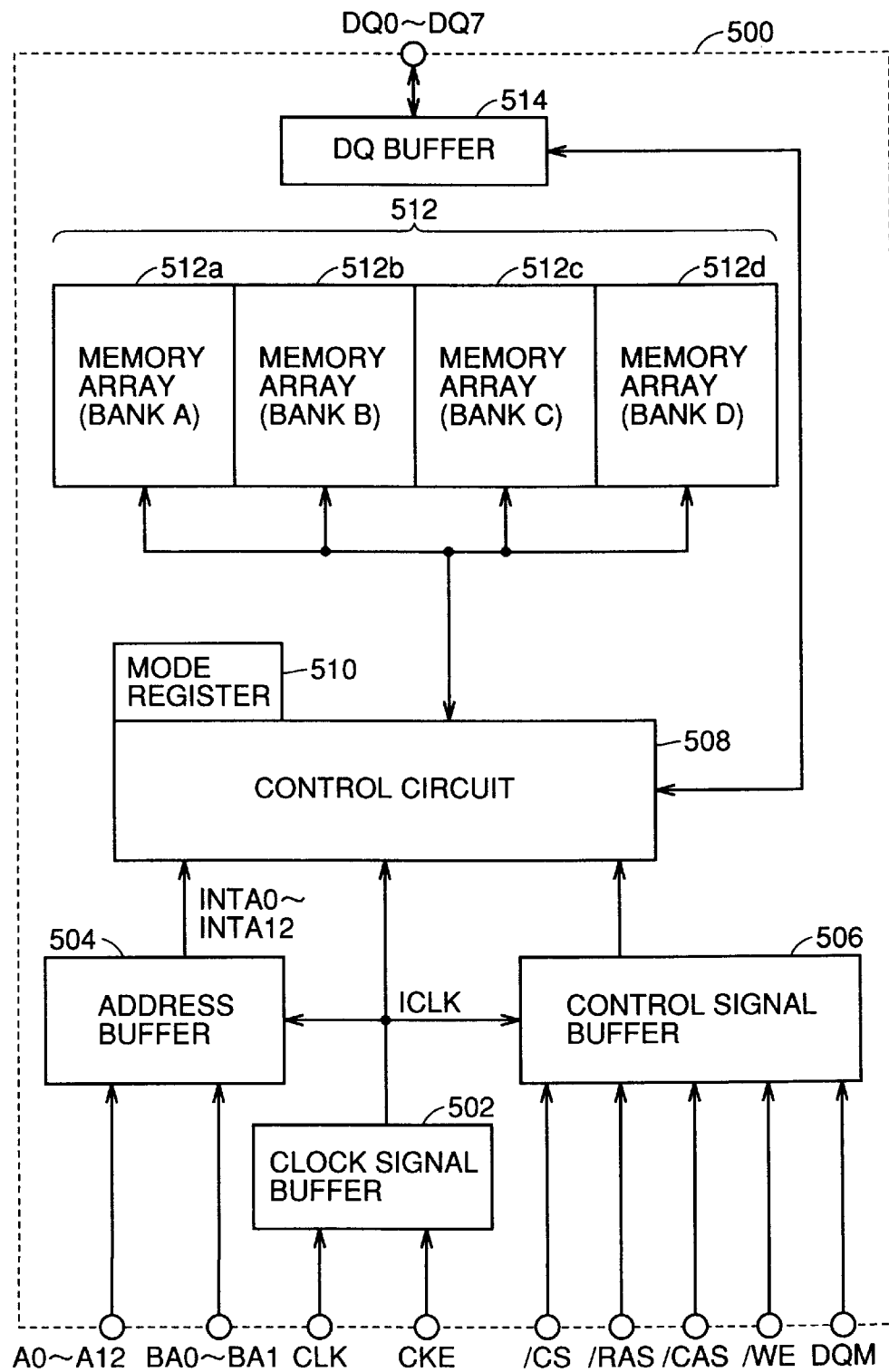
FIG. 11 is a block diagram of a 64-megabit synchronous dynamic random access memory (64M SDRAM) which is an example of a semiconductor memory device according to a third embodiment of the present invention.

FIG. 11 is a block diagram of a 64-megabit synchronous dynamic random access memory (64M SDRAM) which is an example of a semiconductor memory device according to a third embodiment of the present invention.

Referring to FIG. 11, a SDRAM 500 includes an address buffer 504 receiving external address signals A0–A12 and bank address signals BA0 and BA1 to generate internal address signals INTA0–INTA12, a clock signal buffer 502 receiving an external clock signal CLK and a clock enable signal CKE to generate an internal clock signal ICLK, a control signal buffer 506 for receiving a chip select signal /CS, a row address strobe signal /RAS, a column address strobe signal /CAS, a write enable signal /WE, and an input/output DQ mask signal DQM according to internal clock signal ICLK, a control circuit 508 receiving internal clock signal ICLK, internal address signals INTA0–INTA12, and the output of control signal buffer 506 to provide the control of the entire chip, and a mode register 510 for retaining the operation mode of the SDRAM according to the output of control signal buffer 506 by designation of control circuit 508.

SDRAM 500 further includes a DQ buffer 514 to input/output data, and a memory array 512 storing externally applied data. Memory array 512 is divided into the four banks of memory arrays 512a–512d to allow independent operation.

Figure 12:
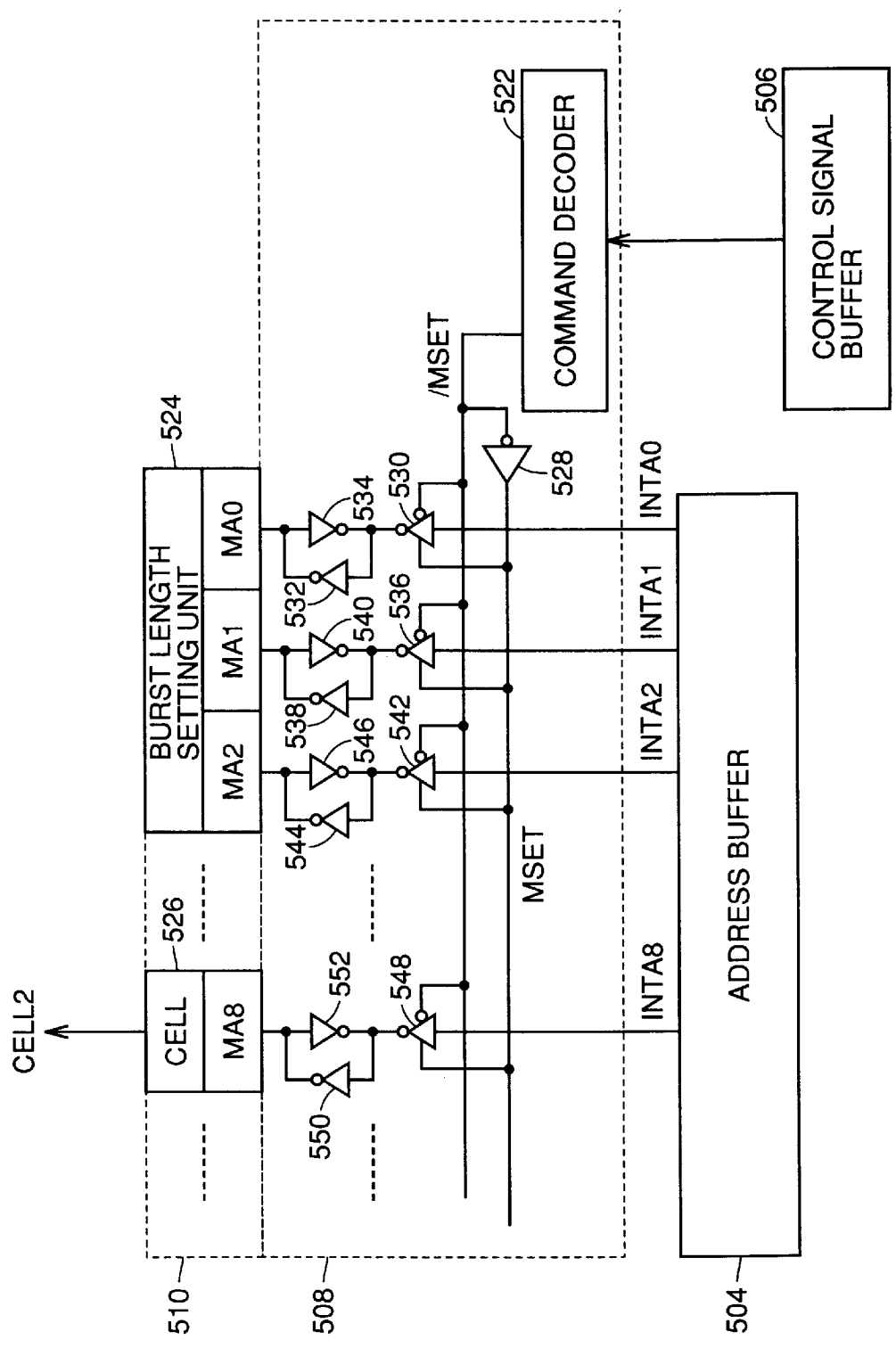
FIG. 12 is a circuit diagram for describing a structure of a mode register 510 and a control circuit 508.

FIG. 12 is a circuit diagram for describing the structure of mode register 510 and control circuit 508. In FIG. 12, only the portion of control circuit 508 related to the data setting towards mode register 5 10 will be depicted.

Referring to FIG. 12, control circuit 508 includes a command decoder 522 receiving the control signal control signal buffer 506 to decode a command, an inverter 528 receiving and inverting a signal /MSET that is temporarily activated to an L level by command decoder 522 when a mode register set command (MRS) for updating the setting mode of mode register 510 to output a mode register set signal MSET, a clocked inverter 530 receiving internal address signal INTA0 and rendered active by mode register set signal MSET, an inverter 532 receiving and inverting the output of clocked inverter 530, an inverter 534 receiving and inverting the output of inverter 532 to output the inverted signal to the input node of inverter 532, a clocked inverter 536 receiving internal address signal INTA1 and rendered active according to mode register set signal MSET, an inverter 538 receiving and inverting the output of clocked inverter 536, an inverter 540 receiving and inverting the output of inverter 538 to output the inverted signal to the input node of inverter 538, a clocked inverter 542 receiving internal address signal INTA2 and rendered active by mode register set signal MSET, an inverter 544 receiving and inverting the output of clocked inverter 542, an inverter 546 receiving and inverting the output of inverter 544 to output the inverted signal to the input node of inverter 544, a clocked inverter 548 receiving internal address signal INTA8 and rendered active by mode register set signal MSET, an inverter 550 receiving and inverting the output of clocked inverter 548, and an inverter 552 receiving and inverting the output of inverter 550 to output the inverted signal to the input node of inverter 550. Mode register 510 includes latch circuits MA0, MA1 and MA2 latching the outputs of inverters 532, 538, 544, respectively, and a latch circuit MA8 latching the output of inverter 550. Here, latch circuits MA0, MA1 and MA2 constitute a burst length setting unit 524 to set the burst length of the SDRAM. Latch circuit MA8 is a mode setting unit 526 that retains the information of mode select signal CELL2 set to an H level in a resume or suspend state.

Figure 13:
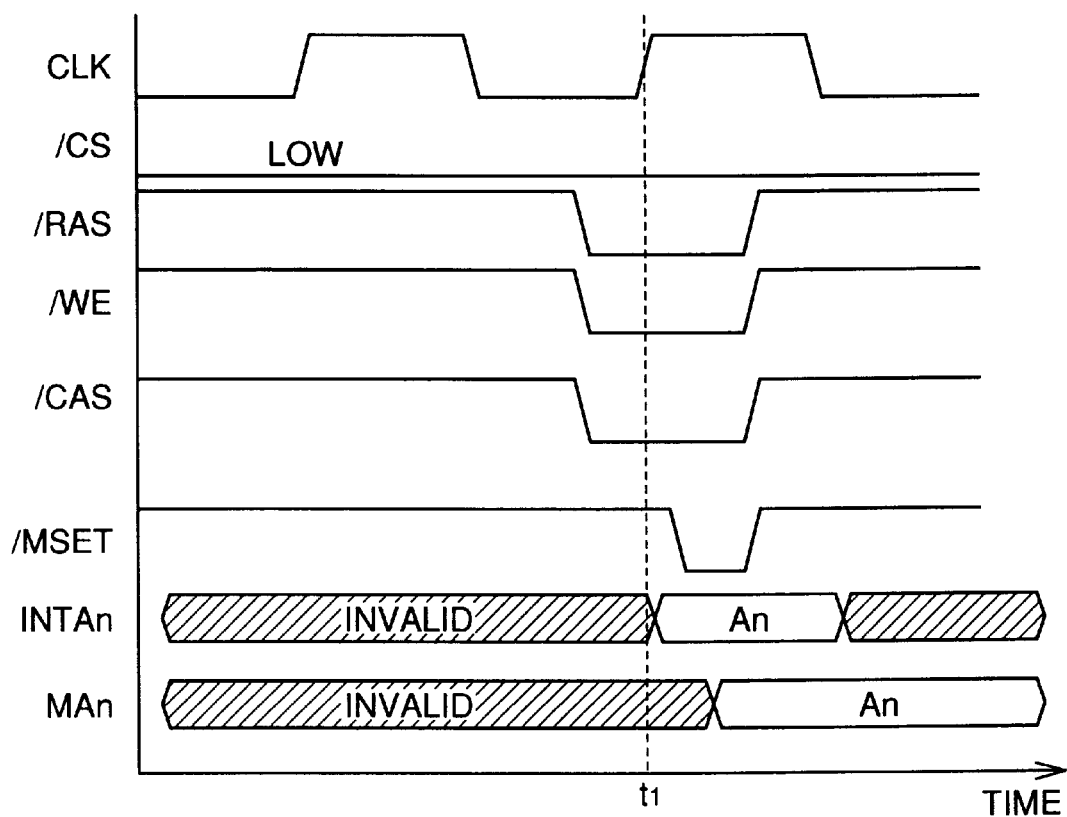
FIG. 13 is an operation waveform diagram for describing mode setting for a mode register.

FIG. 13 is an operation waveform diagram to describe mode setting for the mode register.

At time t1 in FIG. 13, when chip select signal /CS=L, row address strobe signal /RAS=L, write enable signal /WE=L, and column address strobe signal /CAS=L are applied to the control signal buffer at the rise of clock signal CLK, a mode register set command (MRS) is discerned by the command decoder.

In response, a one shot pulse of H→L→H appears in mode register set signal /MSET. Clocked inverters 530, 536, 542 and 548 shown in FIG. 12 are rendered active, whereby internal address signal INTAn is transmitted to mode register MAn to be latched.

The internally latched addresses, for example the addresses in mode registers MA0–MA2, indicate the burst length. Here, MA8 is used as a row decoder control signal CELL2, for example.

Thus, the semiconductor memory device of the second embodiment allows the user to externally control the row decoder. Also, in the operation mode where power is supplied to the semiconductor memory device, the user can change the control mode arbitrarily.

Fourth Embodiment

Figure 14:
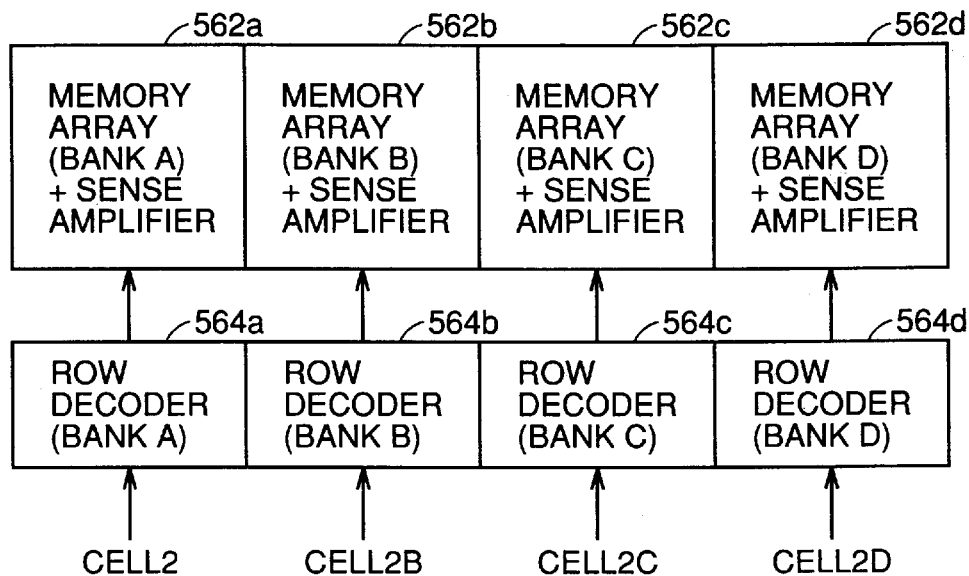
FIG. 14 shows the correspondence between the bank structure and the row decoder in a semiconductor memory device according to a fourth embodiment of the present invention.

FIG. 14 shows the relationship between a bank structure and a row decoder in a semiconductor memory device according to a fourth embodiment of the present invention.

The semiconductor memory device of the fourth embodiment differs from the semiconductor memory device of the third embodiment in that switching is allowed by applying mode select signals CELL2, CELL2B, CELL2C or CELL2D to row decoders 564a, 564b, 564c, and 564d provided corresponding to banks 562a, 562b, 562c, and 562d. Similar to the third embodiment, mode select signals CELL2, CELL2B, CELL2C and CELL2D can be set by the setting of the address terminals when mode register set command (MRS) is input.

Figure 15:
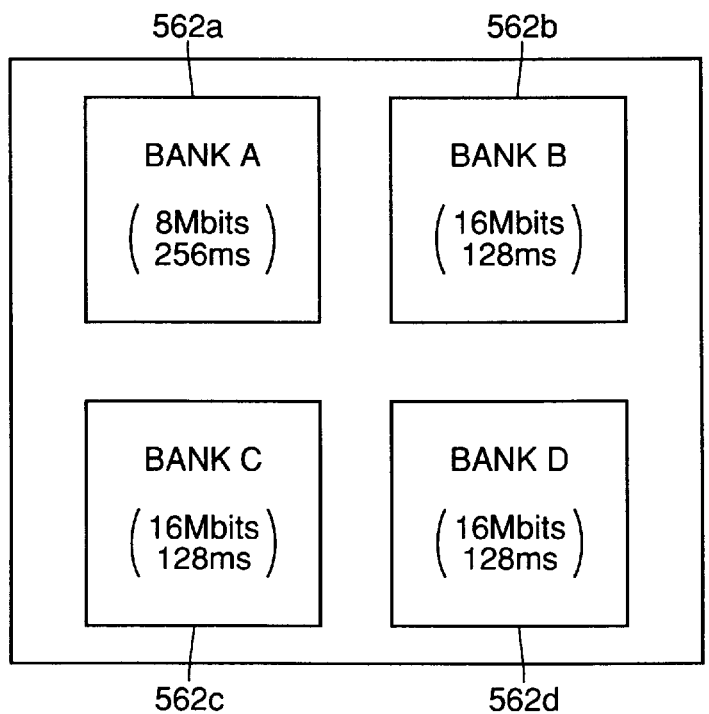
FIG. 15 is a diagram for describing operation mode bank switching.

FIG. 15 is a diagram to describe switching of the operation mode in respective banks.

Referring to FIG. 15, a memory cell array 562a (bank A), for example, can have the refresh cycle set to 256 ms which is approximately two times the former length, although the capacity is only 8 Mbits. The remaining memory arrays 562b–562d (banks B, C, D) have a refresh cycle of 128 ms, although the capacity is 16 Mbits.

Accordingly, banks B, C, D can be used as the DRAM for data storage in the normal usage state, and bank A can be used as the data storage in a resume or suspend state where the frequency of access is low. Since the operation mode of each bank can be respectively set, the balance between the capacity and power consumption can be set as desired by the user according to the application. For a chip where the memory capacity is fixed such as in a DRAM built-in micro computer, the balance between the capacity and the power consumption is variable. There is another advantage that appropriate usage can be effected according to the operation.

Fifth Embodiment

Figure 16:
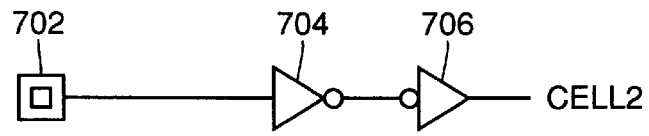
FIG. 16 is a circuit diagram for describing the structure of generating a mode select signal CELL2 according to a fifth embodiment of the present invention.

FIG. 16 is a circuit diagram to describe the structure of generating a mode select signal CELL2 according to a fifth embodiment of the present invention.

Referring to FIG. 16, the semiconductor memory device of the fifth embodiment differs from the semiconductor memory device of the first embodiment in that the former includes a control signal input pad 702, an inverter 704 receiving and inverting the signal applied to pad 702, and an inverter 706 receiving and inverting the output of inverter 704 to output mode select signal CELL2.

Accordingly, mode select signal CELL2 can be controlled by an external source. Furthermore, the operation mode can be fixed by a bonding option at the assembly stage.

Sixth Embodiment

Figure 17:
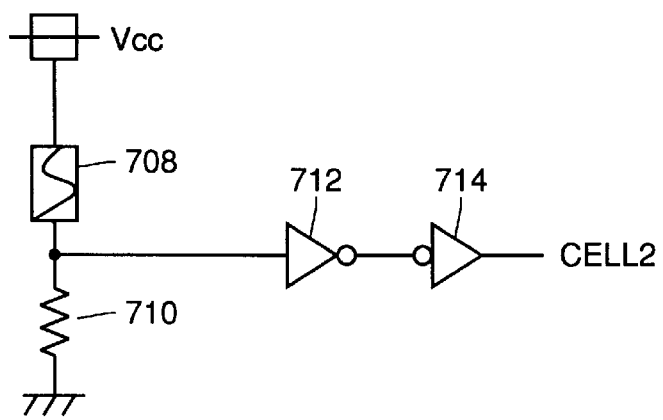
FIG. 17 is a circuit diagram showing the structure of generating mode select signal CELL2 in a semiconductor memory device according to a sixth embodiment of the present invention.
Figure 18:
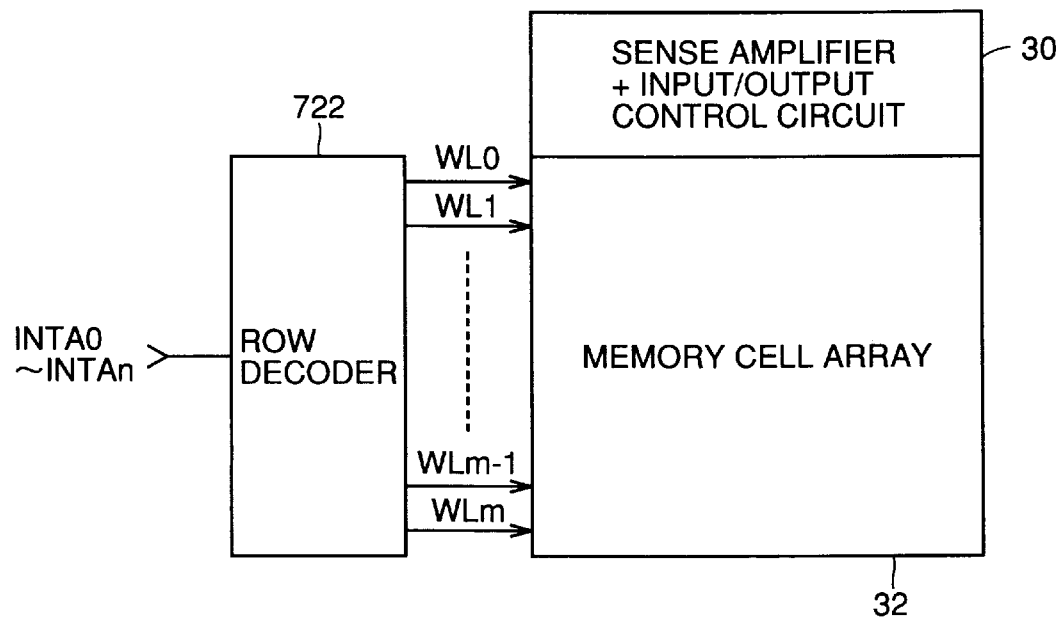
FIG. 18 schematically shows a row decoder and a memory cell array in a DRAM.

FIG. 17 is a circuit diagram showing a structure of generating mode select signal CELL2 in a semiconductor memory device according to a sixth embodiment of the present invention.

Referring to FIG. 17, the semiconductor memory device of the sixth embodiment differs from the semiconductor memory device of the first embodiment in that the former includes a fuse element 708 and a resistor 710 connected in series between a power supply potential Vcc and a ground potential, an inverter 712 receiving and inverting the potential of the connection node of fuse element 708 and resistor 710, and an inverter 714 receiving and inverting the output of inverter 712 to output mode select signal CELL2.

Fuse element 708 is formed of, for example, polysilicon to select a conductive state or a non-conductive state according to laser trimming and the like.

Resistor 710 has a high resistance in the order of MΩ. By blowing out fuse element 708, the input of inverter 712 can be set to an L level by resistor 710. In response, mode select signal CELL2 attains an L level. If fuse element 708 is not blown out, the input of inverter 712 is driven to an H level by external power supply potential Vcc. In response, mode select signal CELL2 attains an H level. The setting is allowed even by replacing the positions of fuse element 708 and resistor 710. Accordingly, a semiconductor memory device can be provided that is operable in a first mode where the refresh cycle is long and the storage capacity is small, or in a second mode where the memory capacity is large, according to the application. Thus, production adjustment and the like according to the operation is facilitated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
   a first memory array, said first memory array including:
      first and second memory cells,
      a first bit line transmitting data input/output with respect to said first and second memory cells,
      a first word line to select said first memory cell, and
      a second word line to select said second memory cell; and
   a cell select circuit activating said first and second word lines for selecting said first and second memory cells according to an address signal, said cell select circuit having a first row decode circuit selecting one of said first and second memory cells according to said address signal in a first mode, and selecting both said first and second memory cells when said address signal specifies said first memory cell in a second mode.

2. The dynamic semiconductor memory device according to claim 1, further comprising a voltage generation circuit supplying an activation potential of said first and second word lines to said first row decode circuit,
   said voltage generation circuit having a current supply capability greater in said second mode than in said first mode.

3. The dynamic semiconductor memory device according to claim 2, said voltage generation circuit including a first oscillation circuit activated in said first mode to generate a first clock signal,
   a second oscillation circuit activated in said second mode to generate a second clock signal having a cycle time shorter than the cycle time of the first clock signal, and
   a charge pump circuit carrying out a boosted operation according to one of said first and second clock signals to supply said activation potential.

4. The dynamic semiconductor memory device according to claim 1, wherein said first row decoder circuit comprises
   a predecode circuit generating first and second predecode signals corresponding to a predetermined bit of said address signal, said predecode circuit rendering one of said first and second predecode signals active according to a logic value of said predetermined bit in said first mode, and rendering both said first and second predecode signals active in said second mode, and
   a word line activation circuit activating said first and second word lines according to said first and second predecode signals.

5. The dynamic semiconductor memory device according to claim 1, wherein said first row decode circuit comprises a delay circuit for delay to set an activating timing of said second word line behind the activating timing of said first word line in said second mode.

6. The dynamic semiconductor memory device according to claim 1, further comprising:
   an address buffer circuit receiving an address signal according to an external clock signal;
   a control signal buffer circuit receiving a control signal according to an external clock signal;
   a command decoder decoding said control signal; and
   a mode register retaining an operation mode corresponding to said address signal according to a decoded result of said command decoder, said mode register including a first retain circuit to retain first mode data that determines in which of said first and second modes said first memory array operates.

7. The dynamic semiconductor memory device according to claim 6, further comprising a second memory array,
   said first and second memory arrays being banks that are operable independent to each other, and that control said operation modes independently, said second memory array including
third and fourth memory cells,
a second bit line to transmit data input/output with respect to said third and fourth memory cells,
a third word line to select said third memory cell, and
a fourth word line to select said fourth memory cell,
said cell select circuit farther including a second row decode circuit selecting one of said third and fourth memory cells according to said address signal in said first mode, and selecting both said third and fourth memory cells when said address signal specifies said third memory cell in said second mode,
said mode register further including a second retain circuit to retain second mode data that determines in which of said first and second modes said second memory array operates.

8. The dynamic semiconductor memory device according to claim 1, further comprising a control terminal that can apply an external potential, wherein one of said first and second modes is selected according to a potential of said control terminal.

9. The dynamic semiconductor memory device according to claim 1, further comprising a fuse element connected between an external power supply node and an internal node, wherein said fuse element can select one of a conductive state and a nonconductive state, wherein one of said first and second modes is selected according to a potential of said internal node.

10. The dynamic semiconductor memory device according to claim 1, further comprising a fuse element connected between a ground node and an internal node, wherein said fuse element can select one of a conductive state and a nonconductive state, wherein any of said first and second modes is selected according to a potential of said internal node.

* * * * *